US011495502B2

United States Patent
Tu et al.

(10) Patent No.: US 11,495,502 B2
(45) Date of Patent: Nov. 8, 2022

(54) MANUFACTURING METHOD OF FIN FIELD-EFFECT TRANSISTOR

(71) Applicant: SHANGHAI HUALI INTEGRATED CIRCUIT CORPORATION, Shanghai (CN)

(72) Inventors: Huojin Tu, Shanghai (CN); Jueyang Liu, Shanghai (CN); Zhanyuan Hu, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 31 days.

(21) Appl. No.: 17/203,448

(22) Filed: Mar. 16, 2021

(65) Prior Publication Data
US 2021/0375696 A1    Dec. 2, 2021

(30) Foreign Application Priority Data

May 29, 2020  (CN) .......................... 202010478559.0

(51) Int. Cl.
*H01L 21/8238*    (2006.01)

(52) U.S. Cl.
CPC ............... *H01L 21/823821* (2013.01); *H01L 21/823814* (2013.01)

(58) Field of Classification Search
CPC ..... H01L 21/823821; H01L 21/823814; H01L 29/66795
See application file for complete search history.

(56) References Cited

U.S. PATENT DOCUMENTS

| | | | |
|---|---|---|---|
| 11,195,763 B2* | 12/2021 | Chiang | H01L 29/0653 |
| 2019/0051565 A1* | 2/2019 | Baars | H01L 27/0925 |
| 2020/0035809 A1* | 1/2020 | Lin | H01L 21/823821 |
| 2021/0366780 A1* | 11/2021 | Huang | H01L 23/535 |

* cited by examiner

*Primary Examiner* — Karen Kusumakar
*Assistant Examiner* — Adam S Bowen
(74) *Attorney, Agent, or Firm* — Alston & Bird LLP

(57) ABSTRACT

The disclosure provides a manufacturing method for a fin field-effect transistor. The method to make the fin field-effect transistor comprises: forming a fin structure and a gate structure spanning on the fin structure on a substrate; and forming a source-drain region on the fin structure, which comprises: forming an epitaxial layer; and forming a sacrificial layer on the surface of the epitaxial layer to prevent the epitaxial layer from being lost in the subsequent removal steps.

19 Claims, 3 Drawing Sheets

MANUFACTURING METHOD OF FIN FIELD-EFFECT TRANSISTOR

CROSS-REFERENCES TO RELATED APPLICATIONS

This application claims priority to Chinese patent application No. CN 202010478559.0, filed on May 29, 2020 at CNIPA, and entitled "A MANUFACTURING METHOD OF FIN FIELD-EFFECT TRANSISTOR", the disclosure of which is incorporated herein by reference in entirety.

TECHNICAL FIELD

This invention relates to the field of semiconductor chip manufacturing, in particular, it relates to a manufacturing method of fin field-effect transistor.

BACKGROUND

A Fin field-effect transistor is a kind of new complementary metal oxide semiconductor (CMOS) transistor. The main character of a Fin field-effect transistor is the fin semiconductor wrapped by a gate electrode in the channel region. The length of the fin along the source-drain direction is the length of channel. The structure wrapped by the gate electrode enhances the control ability of the gate and provides a better electrical control for the channel. Compared with a conventional planar transistor, there are several advantages for a fin field-effect transistor:

(1) The channel of a fin field-effect transistor is generally lightly doped or even undoped, which avoids the scattering effect of discrete doping atoms. Compared with a heavily doped planar transistor, the carrier mobility of a fin field-effect transistor is greatly improved;

(2) Compared with a conventional planar CMOS, a fin field-effect transistor has overwhelming advantages in suppressing subthreshold leakage and gate leakage currents. The fin structures of the fin field-effect transistor, such as the double gate or half-circle gate, increase the gate control region of the channel, which greatly enhances the gate control ability, effectively suppressing the short-channel effect and reducing the subthreshold leakage current.

(3) Due to the suppressed short-channel effect and enhanced gate control ability, the fin field-effect transistor has a thicker gate oxide layer than a conventional transistor, thus it reduces the gate leakage current.

(4) Due to the fact that the fin field-effect transistor can be made in compatible processes as the current CMOS, it is technically easy to implement.

Therefore, fin field-effect transistors have been put in practice by many companies into their small-size semiconductor device products.

However, in the present manufacturing process of the N-metal-oxide-semiconductor (NMOS), the hard mask layer covering the surface is removed after forming the epitaxial layer in the source-drain region. However, during the removing step and other subsequent steps, the epitaxial layer tends to wear out, which seriously affects the quality of the fin structures.

To solve this problem, a manufacturing method of fin field-effect transistor is provided in this disclosure.

BRIEF SUMMARY OF THE DISCLOSURE

A brief overview of one or more embodiments is provided below. The summary is not an extensive overview of all of the aspects that are contemplated, and is not intended to identify key or decisive elements in all aspects. The summary is a simplified form as a prelude to the more detailed description presented later.

According to one embodiment of the present invention, a method of manufacturing a fin field-effect transistor, comprising: providing a substrate; forming a fin structure on the substrate and a gate structure spanning on the fin structure; and forming a source-drain region on the fin structure, comprising: forming an epitaxial layer; and forming a sacrificial layer on a surface of the epitaxial layer, wherein the sacrificial layer protects the epitaxial layer from loss in subsequent removing steps.

In some examples, the substrate is divided into a first region and a second region, wherein the fin structure comprises a first fin structure located in the first region and a second fin structure located in the second region, wherein the gate structure comprises a first gate structure located in the first region and a second gate structure located in the second region, wherein the first gate structure is configured to be on a top of a middle portion of the first fin structure and the second gate structure is configured to be on a top of a middle portion of the second fin structure; wherein a N-type fin field-effect transistor is formed in the first region, and wherein a P-type fin field-effect transistor is formed in the second region;

wherein the forming of the epitaxial layer comprises: forming a hard mask layer in the first region and the second region; opening the hard mask layer in the first region to expose the first fin structure; and forming a N-type epitaxial layer at two sides of the first gate structure on the first fin structure located;

wherein the forming of the sacrificial layer on a surface of the epitaxial layer comprises: forming the sacrificial layer on a surface of the N-type epitaxial layer of the first fin structure; and wherein the forming the epitaxial layer further comprises: removing the hard mask layer from the second region to expose the second fin structure, wherein the sacrificial layer protects the N-type epitaxial layer from being consumed in the subsequent removing steps.

In some examples, the N-type epitaxial layer comprises a buffer layer and a bulk layer, wherein the bulk layer and the buffer layer are both doped with phosphorus, wherein the bulk layer has a higher phosphorus concentration than the buffer layer does; and wherein the sacrificial layer is disposed to cover a surface of the bulk layer to cover the bulk layer.

In some examples, the sacrificial layer is consumed in the subsequent removing steps.

In some examples, a material of the sacrificial layer is silicon.

In some examples, the sacrificial layer is lightly doped of phosphorus, boron or germanium.

In some examples, the forming the sacrificial layer further comprises: determining a thickness of the sacrificial layer based on a consumed thickness of the epitaxial layer in the removing steps.

In some examples, determining the thickness of the sacrificial layer based on a reaction of corrosive materials used in the removing steps with the sacrificial layer and the consumed thickness of the epitaxial layer in the removing steps.

In some examples, the sacrificial layer is formed between 500° C. and 800° C.

In some examples, the sacrificial layer is formed at a pressure between 1 and 100 Torr.

BRIEF DESCRIPTION OF THE DRAWINGS

The above features and advantages of the present invention will be better understood after reading the detailed description of the embodiments of the present disclosure in conjunction with the following figures.

Figure 1A:
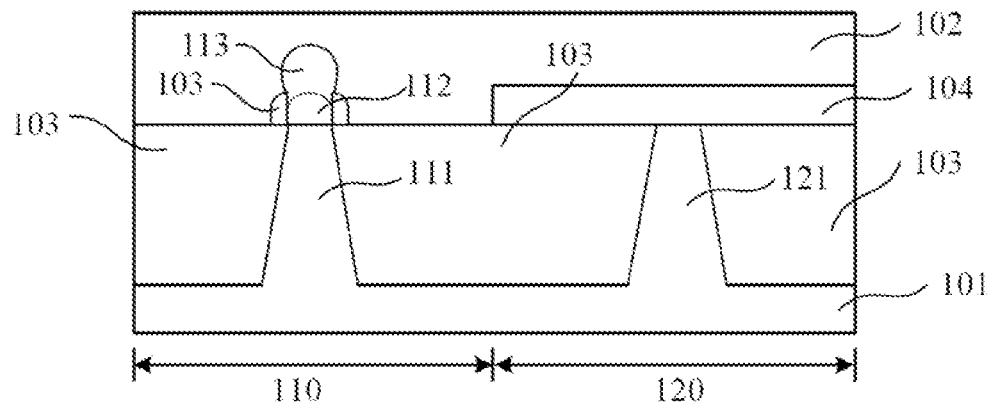
FIG. 1A shows a schematic cross-sectional view of a Fin-FET structure according to the related art.

For clarity, a brief description of the reference numerals is given below:

101, 201 Substrate
102, 202 Gate structure
103, 203 Isolation structure
104, 204 Hard mask layer
110, 210 First region
120, 220 second region
111, 211 First fin structure
112, 212 Buffer layer
113, 213 Bulk layer
121, 221 Second fin structure
111c Middle portion of first fin structure under gate structure
111a, 111c Two ends of first fin structure which are located at both ends of the gate structure.
121c Middle portion of second fin structure under gate structure
121a, 121c Two ends of second fin structure which are located at both ends of the gate structure
214 Sacrificial layer
S310-S214 Steps in the process

DETAILED DESCRIPTION OF THE DISCLOSURE

The following description is presented to enable one of ordinary skill in the art to implement and use the present invention and incorporate it into the context of a particular application. Various modifications, as well as various usages in various applications, will be readily apparent to those skilled in the art, and the generic principles defined herein may be applicable to a wide range of embodiments. Thus, the present invention is not limited to the embodiments presented herein, but rather should be given its broadest scope consistent with the principles and novel features disclosed herein.

In the following detailed description, numerous specific details are set forth to provide a more thorough understanding of the present invention. However, it will be apparent to those skilled in the art that the present invention may be practiced without limitations from these specific details. In other words, well-known structures and devices are shown in a block diagram form and are not shown in detail, so as to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Moreover, any component that does not expressly indicate a device for performing a specific function or a step for performing a specific function in the claims should not be construed as a device or step clause as specified in 35 USC Chapter 112, paragraph 6. In particular, the use of "steps of . . . " or "actions of . . . " in the claims herein does not mean that the provisions of paragraph 6 of 35 USC § 112 are involved.

Note that when used, the flags left, right, front, back, top, bottom, front, back, clockwise, and counter clockwise are used for convenience purposes only and do not imply any specific fixed direction. In fact, they are used to reflect the relative position and/or direction between various parts of an object. In addition, the terms "first" and "second" are only used for descriptive purposes, and cannot be understood as indicating or implying relative importance.

In the description of the present invention, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components. The specific meaning of the above terms in the present invention can be understood in a specific case by those skilled in the art.

Note that in the case of use, further, better, further and more preferably is a simple beginning of another embodiment on the basis of the foregoing embodiment, which is further, better, and further The combination of the content of the ground or the better ground and the foregoing embodiment constitutes a complete composition of another embodiment. After the same embodiment, a number of further, better, further or even better arrangements can be combined to form yet another embodiment.

The invention will be described in detail below in conjunction with the drawings and specific embodiments. Note that the following aspects described in conjunction with the drawings and specific embodiments are only exemplary, and should not be construed as limiting the protection scope of the invention.

First, making a brief introduction of the conventional manufacturing method of Fin-FET, which arrange NMOS and PMOS at intervals to manufacture Fin-FETs, and adjacent NMOS and PMOS to form a CMOS. The invention takes a part of the CMOS generation process as an example to illustrate the conventional Fin-FET manufacturing method so that those skilled in the art can understand the technical concept of the present invention.

Figure 1B:
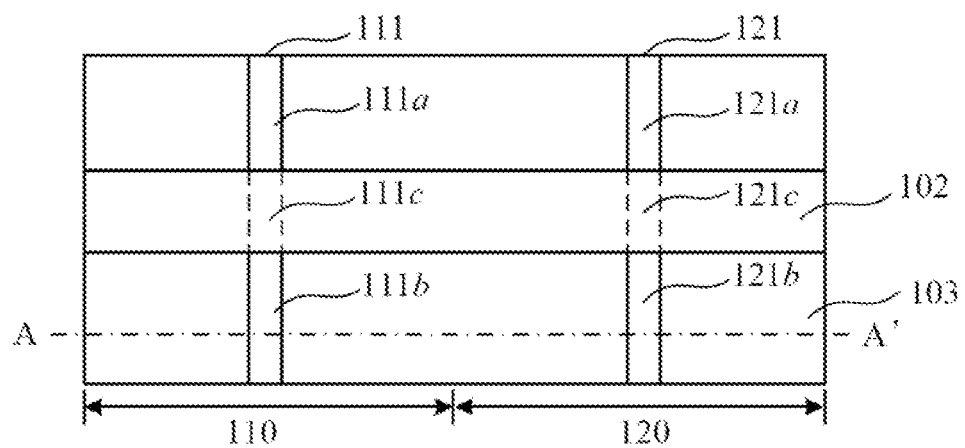
FIG. 1B shows a schematic top view of the Fin-FET structure according to the Fin-FET structure in the related art.

FIG. 1A shows a schematic cross-sectional view of a Fin-FET structure. FIG. 1B shows a schematic top view of a conventional Fin-FET structure, Herein, FIG. 1A is a cross-sectional view along of the cut line of AA' section in FIG. 1B.

As shown in FIG. 1A and FIG. 1B, the conventional manufacturing method of making a Fin-FET comprises:

providing a substrate 101 firstly. The substrate 101 may be a silicon substrate. The substrate 101 in FIGS. 1A and 1B can be divided into a first region 110 and a second region 120. The first region 110 is used to form a N-type fin field-effect transistor, and the second region 120 is used to form a P-type fin field-effect transistor.

Furthermore, the first fin structure 111 and the second fin structure 121 are formed on the first region 110 and the second region 120 of the substrate 101 respectively. The first fin structure 111 and the second fin structure 121 can be formed by appropriate processes including photolithography and etching. For example, the first fin structure 111 and the second fin structure 121 are etched from the substrate 101 using dry etching or plasma process. For example, first, a hard mask layer (HM) is fabricated on the substrate 101, wherein, the hard mask layer may be made of SiN, SiO, SiNO or other proper materials. Second, a photoresist material is spin-coated on the hard mask layer, and the hard mask layer is patterned by using the exposed photoresist layer as a mask. Then, the patterned hard mask layer protects as the mask in an etching process on the substrate 101 to fabricate the first fin structure 111 and the second fin structure 121 respectively in the first region 110 and the second region 120.

Sometimes, as shown in FIG. 1A, an isolation structure 103 may also be fabricated around the first fin structure 111 and the second fin structure 121. The isolation structure 103 is disposed around the first fin structure 111 and the second fin structure 121. The isolation structure may be made of SiO, SiN or other proper materials. The isolation structure 103 may be deposited by the chemical vapor deposition (CVD) process or a spin-on-glass process.

Furthermore, on the isolation structure 103, a gate structure 102 is formed above the middle portion line of the first fin structure 111 and the second fin structure 121. As shown in the top view of FIG. 1B, the first fin structure 111 can be divided into a middle portion 111c and two end portions 111a and 111b; similarly, the second fin structure 121 can be divided into a middle portion 121c and two end portions 121a and 121b. The gate structure 102 is formed above the middle portion 111c of the first fin structure 111 and the middle portion 121c of the second fin structure 121, and is located on the isolation structure 103 across the first fin structure 111 and the second fin structure 121. Therefore, in the top view of FIG. 1B, the middle portion 111c of the first fin structure 111 and the middle portion 121c of the second fin structure 121 are represented by dashed lines to indicate that they are located under the gate structure 102. The gate structure may be a single gate or a multi-gate structure. The formation process of the gate structure 102 can adopt a method of constructing a gate structure commonly used in the art, which will not be described in detail here.

Furthermore, the source region and drain region of N-type Fin-FET are prepared. first, followed by preparing the source region and drain region of P-type Fin-FET. Here it will be focused on describing how to prepare the source region and drain region of the N-type Fin-FET briefly, but skipping description of how to build the source region and drain region of the P-type Fin-FET and the subsequent process.

To prepare the source region and drain region of the N-type Fin-FET, a hard mask layer 104 is first formed on the first fin structure 111, the second fin structure 121, the gate structure 102, and the isolation structure 103. The hard mask layer 104 can be made of SiN or other appropriate materials. The hard mask layer 104 can be formed by a deposition process.

The hard mask layer 104 of the first region 110 is removed by an etching process in order to open the first region 110. Furthermore, an epitaxial layer is formed on the top surface of the first fin structure 111. In a specific embodiment, the epitaxial layer may include the buffer layer 112 and the bulk layer 113 shown in FIG. 1A. The buffer layer 112 may be a silicon phosphate (SiP) SiP layer having a low phosphorus concentration, and the bulk layer 113 may be a SiP layer with a high phosphorus concentration.

In the conventional Fin-FET manufacturing process, after the epitaxial layer is formed, the hard mask layer 104 of the SiP epitaxial layer is removed. The source region and drain region of the P-type Fin-FET are further prepared. There are several steps in the process of preparing the source region and drain region of the P-type Fin-FET, fabricating a hard mask layer for the silicon germanium (SiGe) epitaxial layer, opening the hard mask layer of the second region for depositing the SiGe epitaxial layer, and finally removing the hard mask from the SiGe epitaxial layer.

However, during removal of the hard mask layer from the SiP epitaxial layer and the removal of the hard mask layer from the SiGe epitaxial layer, there will be some loss of the epitaxial layer in the N-type Fin-FET, which will affect the stress level on the NMOS channel, may even seriously affect the quality of Fin-FET device.

Therefore, in order to solve the problem of losing the epitaxial layer of the N-type Fin-FET in the subsequent removing step, a different method for manufacturing NMOS in a fin field effect transistor is needed for advanced process such as the 14 nm note and below.

Figure 3:
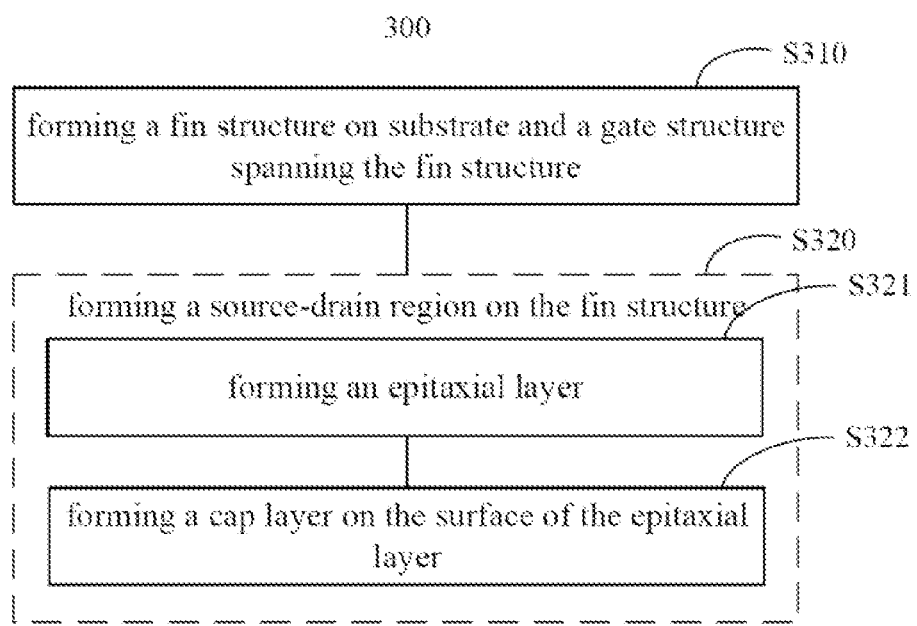
FIG. 3 shows a flow chart of a manufacturing process for Fin-FET according to one embodiment of the invention.

Specifically, as shown in FIG. 3, the process 300 for manufacturing a fin field-effect transistor comprises steps S310-S320.

Step S310 comprises: forming a fin structure and a gate structure spanning on the fin structure on a substrate.

First prepare the fin structure and the gate structure.

Figure 2:
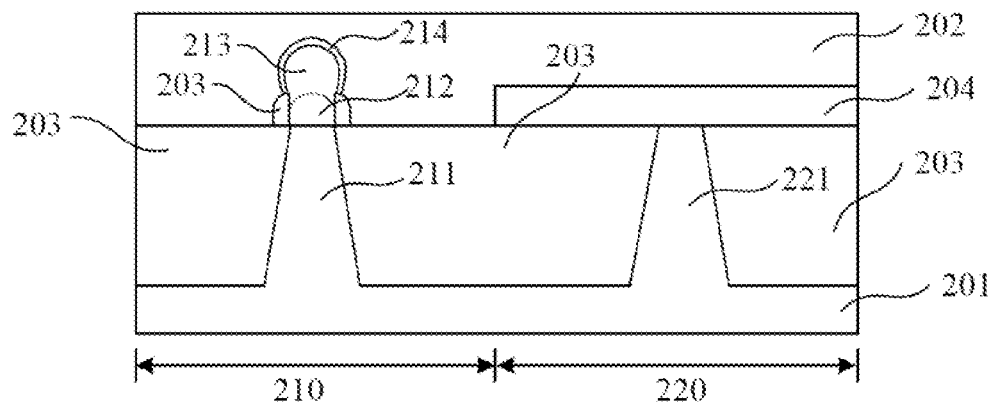
FIG. 2 shows a schematic cross-sectional view of a Fin-FET structure according to one embodiment of the invention.

The structure of the Fin-FET fabricated by the manufacturing method 300 of fin field effect transistor is shown in FIG. 2, and step S310 specifically comprises the following steps.

A substrate 201 is provided. The substrate 201 is divided into a first region 210 and a second region 220.

A first fin structure 211 and a second fin structure 221 are formed on the first region 210 and the second region 220 of substrate 201 respectively. These specific formation process is described above and will not be repeated.

An isolation structure 203 is fabricated around the first fin structure 211 and the second fin structure 221.

A gate structure 202 is formed above the middle portions of the first fin structure 211 and the second fin structure 221. The gate structure 202 locates on the isolation structure 203 across the middle portions of the first fin structure 211 and the second fin structure 221.

Step S320 comprises forming a source-drain region on the fin structure.

Steps S321-S322 comprises forming the source-drain region.

Step S321 comprises forming an epitaxial layer.

Step S322 comprises forming a sacrificial layer on the surface of the epitaxial layer to prevent the epitaxial layer from losing out in the subsequent removal steps. The sacrificial layer may be a cap layer.

In the manufacturing process of Fin-FET in the current art, the process of forming the source region and drain region of the N-type Fin-FET and the process of forming the source region and drain region of the P-type Fin-FET both include the step of removing the hard mask layer, which has caused epitaxial layer loss. Herein, after the epitaxial layer of the N-type Fin-FET is grown, a sacrificial layer is proposed to grow on the surface of the epitaxial layer. As a result, the sacrificial layer will play as the loser on behalf of the epitaxial layer in the subsequent removal step, thereby preventing the epitaxial layer from thinning in the subsequent removal step.

Figure 4:
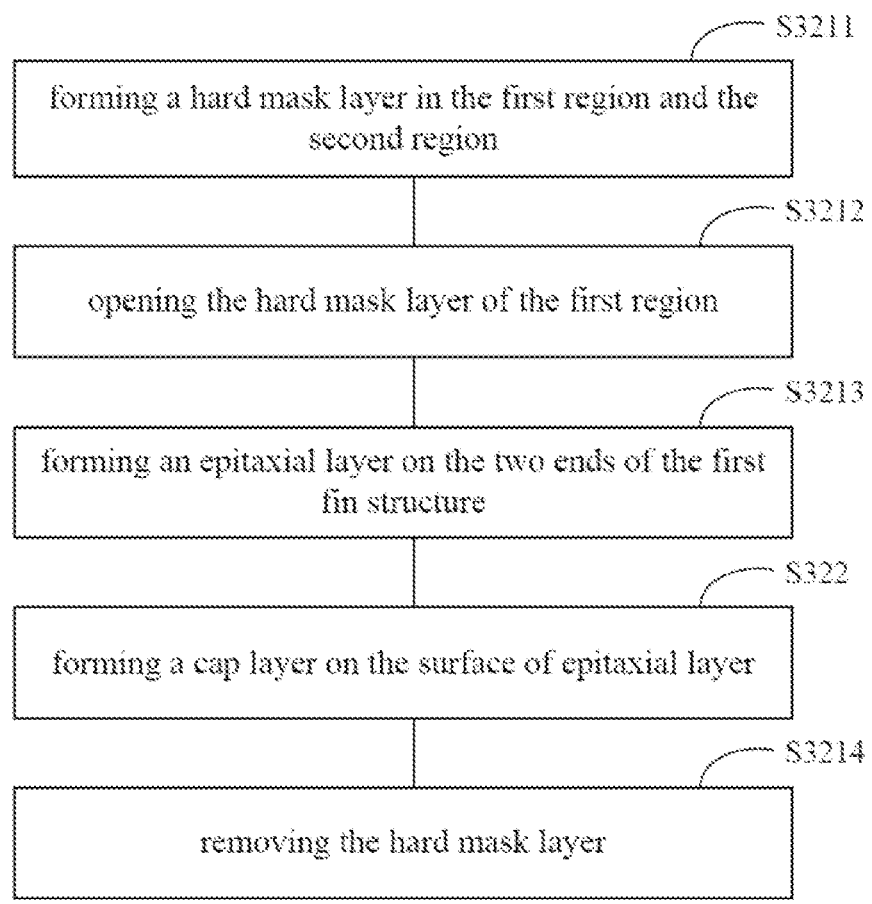
FIG. 4 shows a partial flow chart of a manufacturing process for Fin-FET according to one embodiment of the invention.

Therefore, as shown in FIG. 4, the step S321 of forming the epitaxial layer comprises steps S3211-S3214.

Step S3211 comprises: forming a hard mask layer 204 in the first region 210 and the second region 220.

Step S3212 comprises: opening the hard mask layer of the first region.

Step S3213 comprises: forming an epitaxial layer on the two ends of the first fin structure 210, that is, on the first fin structure located at the two sides of the gate structure 202 (see FIG. 2). The epitaxial layer includes a buffer layer 212 and a bulk layer 213. The phosphorus doping concentration of the bulk layer 213 is greater than the phosphorus doping concentration of the buffer layer 212.

Correspondingly, as shown in FIG. 4, the above step S322 can comprise: forming a sacrificial layer 214 on the surface of epitaxial layer. Specifically, the sacrificial layer 214 can be formed on the surface of the bulk layer 213.

Furthermore, step S214 comprises: removing the hard mask layer 204.

The process of preparing the source region and drain region may also include other comparable process in or after the above steps.

In the subsequent removing steps of the SiP hard mask layer and the SiGe hard mask layer, the sacrificial layer 214 may be partially or completely lost. Preferably, the sacrificial layer 214 is completely lost.

The material of the sacrificial layer 214 may be silicon. Preferably, the sacrificial layer 214 can be made of silicon doped with a trace amount of phosphorus. Therefore, even if the sacrificial layer 214 is not completely lost in the subsequent steps, it will not affect the quality of the Fin-FET made with this method.

Optionally, the sacrificial layer 214 may also be made of silicon doped with a trace amount of boron or germanium.

Preferably, the thickness of the sacrificial layer 214 is in a range of about 1 angstrom to 150 angstrom.

More preferably, the thickness of the sacrificial layer 214 can be set based on the disappeared thickness of the epitaxial layer in the subsequent removing step in the current process, so that the sacrificial layer 214 can be completely used up in the subsequent removal step.

More preferably, the thickness of the sacrificial layer 214 can be set with the lost thickness of the epitaxial layer in the subsequent removal step without the hard mask layer, considering the reactions from the specific materials of the sacrificial layer 214 and other corrosion materials used in the subsequent removal step. For example, when the reaction between the epitaxial layer and the corrosion materials consumes more than the reaction between the sacrificial layer 214 at the thickness of the epi layer and the corrosion materials does, the thickness of the sacrificial layer 214 can be appropriately adjusted to be larger than the original thickness of the epitaxial layer in the subsequent removal steps without the new sacrificial layer. When the reaction with the corrosion materials consumes less than the reaction between the sacrificial layer 214 and the corrosion materials does, the thickness of the sacrificial layer 214 can be appropriately adjusted to be less than the consumed thickness of the epitaxial layer in the subsequent removal step without the sacrificial layer.

Preferably, the sacrificial layer 214 is formed between 500° C. and 800° C.

Preferably, the sacrificial layer 214 is formed between 1 and 100 Torr.

The gases used in the process of forming the sacrificial layer 214 may be an appropriate gas, such as one of $N_2$, $H_2$, dichlorosilane ($SiH_2Cl_2$), silane ($SiH_4$), or phosphine ($PH_3$).

In the steps of the manufacturing method of fin-type field effect transistor, other optional or mandatory actions or steps may also be included.

Although the method is illustrated and described as a series of actions for the purpose of simplifying the explanation, it should be understood and appreciated that these methods are not limited by the sequence of the actions. Those skilled in the art may understand that some actions may occur in different orders and/or concurrently with other actions that are illustrated and described herein or that are not illustrated and described herein, in accordance with one or more embodiments. The key point of the present invention is: after the formation of the epitaxial layer in the N-type Fin-FET is completed, it is necessary to fabricate the sacrificial layer on its surface additionally, and then perform subsequent removal steps and other steps required by the Fin-FET manufacturing process.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of manufacturing a fin field-effect transistor, comprising:

providing a substrate;

forming a fin structure on the substrate and a gate structure spanning on the fin structure; and forming a source-drain region on the fin structure, comprising:

forming an epitaxial layer;

forming a sacrificial layer on a surface of the epitaxial layer, wherein the sacrificial layer protects the epitaxial layer from loss in subsequent removing steps;

wherein the substrate is divided into a first region and a second region, wherein the fin structure comprises a first fin structure located in the first region and a second fin structure located in the second region, wherein the gate structure comprises a first gate structure located in the first region and a second gate structure located in the second region, wherein the first gate structure is configured to be on a top of a middle portion of the first fin structure and the second gate structure is configured to be on a top of a middle portion of the second fin structure; wherein a N-type fin field-effect transistor is formed in the first region, and wherein a P-type fin field-effect transistor is formed in the second region;

wherein the forming of the epitaxial layer comprises:

forming a hard mask layer in the first region and the second region;

opening the hard mask layer in the first region to expose the first fin structure; and forming a N-type epitaxial layer at two sides of the first gate structure on the first fin structure located;

wherein the forming of the sacrificial layer on a surface of the epitaxial layer comprises:
forming the sacrificial layer on a surface of the N-type epitaxial layer of the first fin structure; and
wherein the forming the epitaxial layer further comprises:
removing the hard mask layer from the second region to expose the second fin structure,
wherein the sacrificial layer protects the N-type epitaxial layer from being consumed in the subsequent removing steps.

2. The method of manufacturing the fin field-effect transistor of claim 1, wherein the N-type epitaxial layer comprises a buffer layer and a bulk layer, wherein the bulk layer and the buffer layer are both doped with phosphorus, wherein the bulk layer has a higher phosphorus concentration than the buffer layer does; and wherein the sacrificial layer is disposed to cover a surface of the bulk layer to cover the bulk layer.

3. The method of manufacturing the fin field-effect transistor of claim 1, wherein the sacrificial layer is consumed in the subsequent removing steps.

4. The method of manufacturing the fin field-effect transistor of claim 1, wherein the sacrificial layer is consumed in the subsequent removing steps.

5. The method of manufacturing the fin field-effect transistor of claim 2, wherein the sacrificial layer is consumed in the subsequent removing steps.

6. The method of manufacturing the fin field-effect transistor of claim 1, wherein a material of the sacrificial layer is silicon.

7. The method of manufacturing the fin field-effect transistor of claim 1, wherein a material of the sacrificial layer is silicon.

8. The method of manufacturing the fin field-effect transistor of claim 2, wherein a material of the sacrificial layer is silicon.

9. The method of manufacturing the fin field-effect transistor of claim 4, wherein the sacrificial layer is lightly doped of phosphorus, boron or germanium.

10. The method of manufacturing the fin field-effect transistor of claim 1, wherein the forming the sacrificial layer further comprises:
determining a thickness of the sacrificial layer based on a consumed thickness of the epitaxial layer in the removing steps.

11. The method of manufacturing the fin field-effect transistor of claim 1, wherein the forming the sacrificial layer further comprises:
determining a thickness of the sacrificial layer based on a consumed thickness of the epitaxial layer in the removing steps.

12. The method of manufacturing the fin field-effect transistor of claim 2, wherein the forming the sacrificial layer further comprises:
determining a thickness of the sacrificial layer based on a consumed thickness of the epitaxial layer in the removing steps.

13. The method of manufacturing the fin field-effect transistor of claim 10, wherein the determining the thickness of the sacrificial layer based on the consumed thickness of the epitaxial layer in the removing steps comprises:
determining the thickness of the sacrificial layer based on a reaction of corrosive materials used in the removing steps with the sacrificial layer and the consumed thickness of the epitaxial layer in the removing steps.

14. The method of manufacturing the fin field-effect transistor of claim 1, wherein the sacrificial layer is formed between 500° C. and 800° C.

15. The method of manufacturing the fin field-effect transistor of claim 1, wherein the sacrificial layer is formed between 500° C. and 800° C.

16. The method of manufacturing the fin field-effect transistor of claim 2, wherein the sacrificial layer is formed between 500° C. and 800° C.

17. The method of manufacturing the fin field-effect transistor of claim 1, wherein the sacrificial layer is formed at a pressure between 1 and 100 Torr.

18. The method of manufacturing the fin field-effect transistor of claim 1, wherein the sacrificial layer is formed at a pressure between 1 and 100 Torr.

19. The method of manufacturing the fin field-effect transistor of claim 2, wherein the sacrificial layer is formed at a pressure between 1 and 100 Torr.

* * * * *